United States Patent
Zenbutsu

(10) Patent No.: US 8,084,520 B2
(45) Date of Patent: Dec. 27, 2011

(54) EPOXY RESIN COMPOSITION AND SEMICONDUCTOR DEVICE

(75) Inventor: Shinichi Zenbutsu, Utsunomiya (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 818 days.

(21) Appl. No.: 11/572,837

(22) PCT Filed: Jul. 28, 2005

(86) PCT No.: PCT/JP2005/014249
§ 371 (c)(1), (2), (4) Date: Jan. 29, 2007

(87) PCT Pub. No.: WO2006/011662
PCT Pub. Date: Feb. 2, 2006

(65) Prior Publication Data
US 2008/0064791 A1    Mar. 13, 2008

(30) Foreign Application Priority Data
Jul. 29, 2004  (JP) .................. 2004-221780

(51) Int. Cl.
C08K 5/00 (2006.01)
C08K 3/10 (2006.01)
C04B 26/06 (2006.01)

(52) U.S. Cl. ........................ 523/457; 524/437

(58) Field of Classification Search .................. 523/457; 524/437
See application file for complete search history.

(56) References Cited

U.S. PATENT DOCUMENTS
6,297,306 B1 * 10/2001 Osada et al. .................. 524/406

FOREIGN PATENT DOCUMENTS

| CN | 1345896 A | 4/2002 |
|---|---|---|
| JP | 4 188855 | 7/1992 |
| JP | 10 182941 | 7/1998 |
| JP | 11-140277 | 5/1999 |
| JP | 2000 230111 | 8/2000 |
| JP | 2001 122943 | 5/2001 |
| JP | 2001 220497 | 8/2001 |
| JP | 2003-155326 | 5/2003 |
| JP | 2003-252959 | 9/2003 |
| JP | 2003 277585 | 10/2003 |
| JP | 2003-292569 A | 10/2003 |
| JP | 2003-292731 | 10/2003 |
| JP | 2004-002574 A | 1/2004 |
| JP | 2004 35781 | 2/2004 |

OTHER PUBLICATIONS

Machine translation of JP 10-182941. Translation printed Nov. 13, 2009. Original document published Jul. 7, 1998.*
Machine translation of JP 2003-277585. Translation printed Mar. 8, 2010. Original document published Oct. 2, 2003.*
Machine translation of JP 2001-122943. Translation printed Mar. 8, 2010. Original document published May 8, 2001.*
Office Action issued Sep. 19, 2011 in Korean Application No. 10-2007-7001178 (with translation).
Office Action issued Oct. 25, 2011 in Japanese Patent Application No. 2006-527895 (with English translation).

* cited by examiner

*Primary Examiner* — Liam Heincer
(74) *Attorney, Agent, or Firm* — Oblon, Spivak, McClelland, Maier & Neustadt, L.L.P.

(57) ABSTRACT

An epoxy resin composition comprising (A) an epoxy resin (B) a phenol resin, (C) a curing accelerator, (D) silica, and (E) alumina and/or aluminum hydroxide, wherein the amount of aluminum to the total amount of the epoxy resin composition is 0.25-5 wt % and 70 wt % or more of the silica has an average particle size of 25 μm or less. The epoxy resin composition for semiconductor encapsulating and a semiconductor device comprising a semiconductor element encapsulated using the composition possess excellent characteristics in reliability during high temperature operation.

18 Claims, No Drawings

EPOXY RESIN COMPOSITION AND SEMICONDUCTOR DEVICE

TECHNICAL FIELD

The present invention relates to an epoxy resin composition for semiconductor encapsulating and a semiconductor device using the epoxy resin composition. The epoxy resin composition is suitably used particularly in semiconductor devices for electronic components for which operation under a high temperature environment exceeding 150° C. must be guaranteed, such as electronic components of vehicles, for example.

BACKGROUND ART

Transfer molding of an epoxy resin composition is a suitable encapsulating method for low cost mass production of semiconductor devices such as ICs and LSIs. This method has been used for years, while its performance has been improved in respect of reliability through improvement of the epoxy resin and the phenol resin used as a curing agent. However, in the recent market trend requiring miniaturization, weight saving, and increased performance of electronic equipment, semiconductor devices have also become highly integrated year by year. This trend has increased requirements for the epoxy resin composition for semiconductor encapsulating. A semiconductor for vehicles particularly requires the guarantee of operation under a severe high temperature environment in the engine compartment or the vehicle body. Not only mounting characteristics such as solder resistant properties that have been conventionally required, but also reliability during high temperature storage (hereinafter referred to as "HTSL" (high temperature storage life)) and high temperature operation (hereinafter referred to as "HTOL" (high temperature operation life)) are required HTSL refers to life under high temperature storage without electric current for operation, whereas HTOL refers to life under high temperature while the device is operated by applying electric current.

Generally, a semiconductor element and a lead frame in a semiconductor device are connected using a gold wire. On the lead frame side, in particular the gold wire is joined with aluminum pad by heat and ultrasonic waves. In this instance, gold and aluminum produces an alloy, which is referred to as eutectic crystal or an intermetallic compound. The intermetallic compound grows during storage under high temperature conditions and produces cracks and corrosion, which cause a problem of a connection resistance increase. On the other hand when the device is operated by causing a current to pass through under high temperature conditions, the phenomenon taking place is one under an the environment in which a flow of electrons is produced due to passage of an actual current. The behavior is different from that exhibited during high temperature storage without a current flow. Particularly under the conditions of a high temperature and large current, transfer of intermetallic compounds by electrons (electric migration) induces problems such as transfer of the intermetallic compounds in the cathode, cracks and voids in the junction area, an increase in resistance, and conduction failure.

In order to improve the high temperature storage life (HTSL) under high temperature conditions, a method of decreasing the amount of impurities in the epoxy resin composition as much as possible, a method of adding an ion catcher, a method of using a resin substantially not containing a flame retardant such as bromine and antimony oxide, and the like, are becoming common techniques of maintaining the reliability during high temperature storage. Although these techniques can reduce ionic impurities and improve HTSL, the actual working state of the semiconductor elements, that is, the high temperature operating life (HTOL) can not necessarily be satisfied (for example, Japanese Patent Application Laid-open No. 2004-035781 (2-20 pages), Japanese Patent Application Laid-open No. 2000-230111 (2-6 pages)).

The present invention has been achieved to solve these problems in conventional technologies. Therefore an object of the present invention is to provide an epoxy resin composition for semiconductor encapsulating and a semiconductor device having improved high temperature operation life (HTOL), particularly excelling in reliability during operation under a high temperature environment of more than 150° C. that occurs in vehicles and the like.

DISCLOSURE OF THE INVENTION

Specifically, the present invention provides an epoxy resin composition for semiconductor encapsulating comprising (A) an epoxy resin, (B) a phenol resin, (C) a curing accelerator (D) silica, and (E) alumina and/or aluminum hydroxide, wherein the amount of aluminum to the total amount of the epoxy resin composition is 0.25-5 wt % and 70 wt % or more of the silica has an average particle size of 25 μm or less.

The present invention also provides a semiconductor device comprising a semiconductor element encapsulated using the epoxy resin composition.

Since the epoxy resin composition for semiconductor encapsulating and the semiconductor device possess excellent reliability during high temperature operation, particularly during operation under the high temperature environment of more than 150° C., the present invention is suitably applied to semiconductor devices used in electronic parts for vehicles and the like.

BEST MODE FOR CARRYING OUT THE INVENTION

The epoxy resin (A) used for the epoxy resin composition for semiconductor encapsulating of the present invention is a monomer, oligomer, or a polymer having two or more epoxy groups in the molecule. There are no specific limitations to the molecular weight and molecular structure. Examples include a bisphenol A type epoxy resin, phenolnovolac epoxy resin, o-cresolnovolac epoxy resin, naphtholnovolac epoxy resin, dicyclopentadiene-modified phenol epoxy resin, stilbene epoxy resin, triphenolmethane epoxy resin, alkyl-modified triphenolmethane epoxy resin, and triazine-nucleus-containing epoxy resin. These epoxy resins can be used either individually or in combination of two or more.

The use of the epoxy resin shown by the following formula (1) as the epoxy resin (A) in an amount of 40-100 wt %, preferably 50-100 wt %, and particularly preferably 70-100 wt % of the total amount of the epoxy resin (A) is preferable, because a composition with a low modulus of elasticity and low water absorption can be obtained, improvement in solder heat resistance can be expected, and HTOL can be improved.

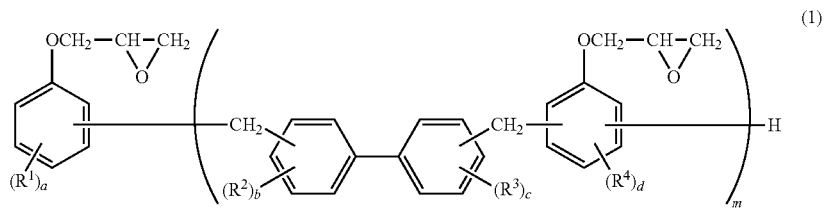

(1)

wherein $R^1$, $R^2$, $R^3$, and $R^4$ are individually a hydrogen atom or an alkyl group having 1-4 carbon atoms, a and d are individually a integer of 0-3, b and c are individually a integer of 0-4, and m is an average of positive numbers.

In the above formula (1), $R^1$, $R^2$, $R^3$, and $R^4$ are preferably hydrogen atoms, and m is most commonly 1-3. Epoxy resin represented by formula (1) has an epoxy equivalent of 265-285 and a softening point of 50-63° C. The reason why the use of the epoxy resin represented by formula (1) exceeding a certain amount increases HTOL is as follows. When the device is operated by causing a current to flow under high temperature conditions, the eutectic of gold and aluminum moves from the junction to outside the junction, which is a phenomenon called migration. If migration starts, a clearance is produced in the junction and electric resistance increases to heat the junction. Due to the heat generated, the perimeter of the junction is exposed to a temperature higher than 150-200° C., which is the atmospheric temperature of the semiconductor device causing the junction area to expand. On the other hand, the cured product of the resin composition encapsulating the junction area is not affected by the atmospheric temperature and does not expand. As a result, a compressive stress is applied to the junction area. This compressive stress accelerates migration of gold-aluminum eutectic crystals. The use of the epoxy resin shown by the formula (1) having a low modulus of elasticity at a high temperature under such a situation makes it easy for the cured component of the resin composition to deform in the junction area. Thus, the compressive stress in the junction area can be decreased, and migration of gold-aluminum eutectic crystals can be suppressed, resulting in improvement of the HTOL characteristics.

The phenol resin (B) used for the epoxy resin composition for semiconductor encapsulating of the present invention includes all of the monomers, oligomers, and polymers having two or more phenolic hydroxyl groups in the molecule. There are no specific limitations to the molecular weight and molecular structure. For example, a phenol novolac resin, cresol novolac resin, dicyclopentadiene-modified phenol resin, terpene-modified phenol resin, phenol aralkyl resin, naphthol aralkyl resin, and the like can be given. Resins possessing a phenylene skeleton or a biphenylene skeleton are preferable as the phenol aralkyl resin or the naphthol aralkyl resin respectively.

The use of the phenol resin shown by the following formula (2) or the phenol resin shown by the following formula (3) as the phenol resin (B) in an amount of 40-100 wt %, preferably 50-100 wt %, and particularly preferably 70-100 wt % of the total amount of the phenol resin (B) is preferred, because a composition with a low modulus of elasticity and low water absorption can be obtained, improvement in solder heat resistance can be expected, and HTOL can be improved.

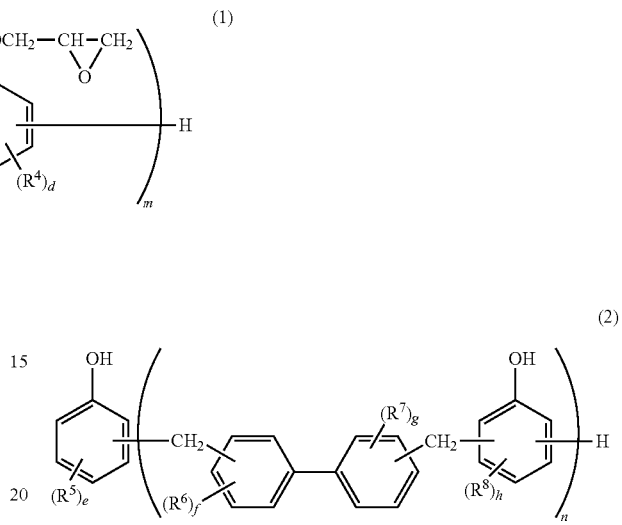

(2)

wherein $R^5$, $R^6$, $R^7$, and $R^8$ are individually a hydrogen atom or an alkyl group having 1-4 carbon atoms, e and h are individually a integer of 0-3, f and g are individually a integer of 0-4, and n is an average of positive numbers.

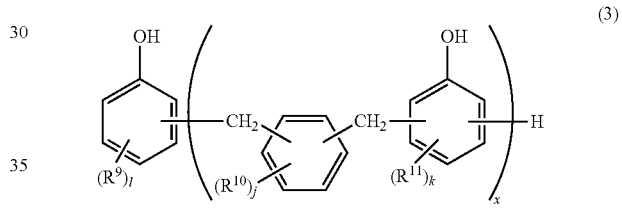

(3)

wherein $R^9$, $R^{10}$, and $R^{11}$ are individually a hydrogen atom or an alkyl group having 1-4 carbon atoms, i and k are individually a integer of 0-3, j is a integer of 0-4, and x is an average of positive numbers.

In the above formula (2), $R^5$, $R^6$, $R^7$, and $R^8$ are preferably hydrogen atoms and n is most commonly 1-3. The phenol resin represented by formula (2) has a hydroxyl equivalent of 190-210 and a softening point of 63-70° C. In the above formula (3), $R^9$, $R^{10}$, and $R^{11}$ are preferably hydrogen atoms and x is most commonly 1-5. The phenol resin represented by formula (3) has a hydroxyl equivalent of 165-190 and a softening point of 75-90° C. The same reason as that mentioned for the increase of HTOL by the use of the epoxy resin represented by formula (1) exceeding a certain amount applies to the use of the phenol resins represented by formula (2) and/or formula (3) exceeding a certain amount. The phenol resins represented by formula (2) and formula (3) may be used in combination, in which case the total amount should be within the above range.

As the curing accelerator (C) used in the epoxy resin composition for semiconductor encapsulating of the present invention, any curing accelerators commonly used as encapsulating materials that can accelerate the reaction of the epoxy group with the phenolic hydroxyl group can be used without a specific limitation. As examples of such a curing accelerator amine compounds such as 1,8-diazabicyclo(5,4,0)undecene-7, imidazole compounds such as 2-methylimidazole, and organic phosphorus compounds such as triphenylphosphine can be given. These curing accelerators can be used either individually or in combination of two or more.

The silica (D) used in the epoxy resin composition for semiconductor encapsulating of the present invention includes, but is not limited to, fused spherical silica and granular fused silica. Of these, fused spherical silica is most preferable. These types of silica may be used either individually or in combination of two or more. The surface of the silica may be treated with a coupling agent. Silica particles with as large sphericity as possible and a broad particle size distribution are preferable in view of improvement of fluidity.

In the present invention, 70 wt % or more of silica particles in the total amount of silica (D) has an average particle diameter of 25 μm or less for improving HTOL. If a current is caused to flow to operate the device under high temperature conditions, voids and small cracks are produced in the junction of the gold wire and bonding pad due to electric migration as mentioned above. In this instance, if a stress is generated near the bonding pad, the cracks are expanded, causing a conduction failure to easily occur in a short time. 70 wt % or more of silica particles with an average particle diameter of 25 μm or less in the total amount of silica (D) are effective for suppressing occurrence of stress near the bonding pad.

The silica particles with an average particle diameter of 25 μm or less more preferably have an average particle diameter of 15 μm or less. On the other hand, as silica with a maximum particle size, silica particles with a diameter of 75 μm or more are preferably 2 wt % or less, and more preferably 1 wt % or less. The maximum particle size refers to the size of the particles remaining on a wet-type sieve. As silica with a large particle size, silica particles with a diameter of 64 μm or more are preferably 20 wt % or less, and more preferably 10 wt % or less. Particles of large particle size are most commonly measured using a laser particle size distribution. If the silica (D) has an average particle diameter of 25 μm or more, contains particles with a diameter of 75 μm or more in an amount of more than 2 wt %, or contains particles with a diameter of 64 μm or more in an amount of more than 20 wt %, a stress occurs due to the linear expansion difference between large diameter particles in the cured product of the resin composition which exists near the junction area and at the junction area, thereby accelerating conduction failure in the junction. The content of the silica with an average particle diameter of 25 μm or less is 70 wt % or more, preferably 80 wt % or more, and particularly preferably 100 wt %. If the content of the silica is less than 70 wt %, the proportion of large silica particles increases. Such large silica particles produce a stress near the gold wire junction area due to the linear expansion difference between the large particles and the junction, giving rise to a conduction failure in the junction. As the lower limit of the average particle diameter of silica particles, the silica particles are preferably 5 μm or more taking the viscosity increase of the resin composition, cost, and the like into consideration.

The alumina and/or aluminum hydroxide (E) used in the epoxy resin composition for semiconductor encapsulating of the present invention is added in an amount to make the aluminum content (as element) in the epoxy resin composition 0.25-5 wt %, and preferably 1-4 wt %. Aluminum content less than 0.25% cannot provide the epoxy resin composition with sufficient HTOL characteristics. Aluminum content exceeding 5 wt % provides no more additional effect of improving the HTOL characteristics, but causes problems such as a decrease in the strength of the molded product, degraded fluidity of the composition, and the like. Addition of alumina and aluminum hydroxide to an epoxy-resin composition for semiconductor is disclosed in Japanese Patent Application Laid-open No. 10-82941 and the like. However, the object of adding alumina and aluminum hydroxide has conventionally been to exude the heat generated from semiconductor devices or to provide flame retardancy, and not to improve the HTOL characteristics.

The reason why the HTOL is improved by adding a certain amount of aluminum element is as follows. Because the cured product of the resin composition for encapsulating the cathode contains the aluminum element, the eutectic crystals of gold and aluminum is affected by the aluminum concentration of the resin, thereby making it difficult for the gold-aluminum eutectic crystals to move from the cathode to outside the cathode. If the aluminum element is included in the resin composition the growth of eutectic crystals of gold and aluminum is inhibited during high temperature storage life (HTSL). The growth of the gold-aluminum eutectic crystals is inhibited to retard the electrical move even under the HTOL conditions in which the electric current flows. Thus, it is possible to significantly suppress the electric migration by controlling the content of the aluminum element in the epoxy resin composition to 0.25-5 wt %.

The average particle size of alumina is preferably 25 μm or less, and more preferably 15 μm or less. Too large particles are also not preferable. As the maximum particle size limitation, the amount of particles with a diameter of 75 μm or more is 2 wt % or less, and preferably 1 wt % or less. The maximum particle size refers to the size of the particles remaining on a wet-type sieve. As alumina with a large particle size, alumina particles with a diameter of 64 μm or more are preferably 20 wt % or less, ad more preferably 10 wt % or less. As alumina with a small particle size, alumina particles with a diameter of 1 μm or less are preferably 20 wt % or less, and more preferably 10 wt % or less. Particles of large particle size and small particle size are measured using a laser particle size distribution method. Since alumina crystals have directivity due to the hexagonal plane crystal form, a stress is easily generated in the junction area when heated, even if its effect is small. For this reason, the use of spherical alumina is preferable for reducing the stress in the junction area during heating and for improving the HTOL characteristics.

The average particle size of aluminum hydroxide, on the other hand, is preferably 25 μm or less, more preferably 20 μm or less, and still more preferably 10 μm or less. As aluminum hydroxide with a maximum particle size, aluminum particles with a diameter of 75 μm or more are preferably 2 wt % or less, and more preferably 1 wt % or less. The maximum particle size refers to the size of the particles remaining on a wet-type sieve. As aluminum hydroxide with a large particle size, aluminum hydroxide particles with a diameter of 64 μm or more are preferably 20 wt % or less, and more preferably 10 wt % or less. As aluminum hydroxide with a small particle size, aluminum hydroxide particles with a diameter of 0.5 μm or less are preferably 30 wt % or less, and more preferably 15 wt % or less. Particles of large pa ticle size and small particle size are measured using a laser particle size distribution method. The use of aluminum hydroxide with an average particle diameter smaller than the average particle diameter of silica and alumina is preferable for increasing flame retardancy.

The reason why alumina and aluminum hydroxide with the average particle diameter and the particle size distribution of the above-mentioned ranges increase the HTOL is as follows. Although electric migration can be inhibited by adding the aluminum element as mentioned above, the strength of junction areas decreases once the electric migration occurs. On the other hand, a stress is generated in the junction area when a semiconductor device is exposed to a high temperature. If the stress in the junction area exceeds the strength of the junction area, that area peels off causing a phenomenon called bond lift to occur. As a result, the connection resistance increases. Therefore, in addition to significantly inhibiting electric migration, reducing the stress is important for increasing the HTOL.

There are inorganic fillers such as silica, alumina and/or aluminum hydroxide in the resin composition in the form of particles around the perimeter of the junction area. Since the modulus of elasticity of heated inorganic fillers is larger than that of the resin, inorganic fillers are a cause of stress produced in the junction area. To decrease the stress caused by the inorganic fillers, it is necessary to adjust the particle size of the inorganic fillers. Although it is possible to significantly control the electric migration in the resin composition by adding alumina and/or aluminum hydroxide, the alumina and aluminum hydroxide are greater factors in generating a stress in the junction area than fused silica when heated, because the coefficient of linear expansion of alumina and aluminum hydroxide is larger than that of fused silica. Therefore, the stress resulting from alumina and aluminum hydroxide can be controlled by reducing the average particle diameter of alumina and aluminum hydroxide to 25 μm or less. If the average particle diameter of alumina and aluminum hydroxide exceeds 25 μm, bond-lift may be caused and sufficient HTOL characteristics may not be exhibited. The lower limit of the average particle diameter of alumina and aluminum hydroxide particles is preferably 1 μm, taking the viscosity increase of the resin composition, cost, and the like into consideration.

Taking into consideration application of the resin composition of the present invention to semiconductor encapsulating, the alumina and aluminum hydroxide having excellent heat resistance, containing only a small amount of impurities, and exhibiting high chemical resistance are preferable.

To further improve the HTOL characteristics, it is desirable for the epoxy resin composition for semiconductor encapsulating of the present invention to comprise (F) silicone rubber which is solid at 25° C. (solid silicone rubber at 25° C.) and/or silicone oil which is liquid at 25° C. (liquid silicone rubber at 25° C.) in an amount of 0.5-5 wt % of the total amount of the epoxy resin composition. If less than 0.5 wt % the effect of stress reduction to the junction area at a high temperature cannot be sufficiently exhibited. A content exceeding 5 wt % can reduce the stress, but is undesirable due to decrease in fluidity and mechanical strength. The solid silicone rubber at 25° C. has a basic structure of three dimensionally crosslinked organopolysiloxane. Various functional groups can be introduced into the solid silicone rubber without any specific limitations. An epoxy group amino group, methoxy group, phenyl group, carboxyl group hydroxyl group, alkyl group, vinyl group, mercapto group, and the like can be given as examples. There are no specific limitations to the method for obtaining organopolysiloxane. Usually, the organopolysiloxane can be obtained by polymerizing organochlorosilanes such as methylchlorosilane, trimethyltrichlorosilane and dimethyldichlorosilane. There are also no specific limitations to the method for introducing various functional groups into the solid silicone rubber. A method of adding an allyl compound having various functional groups by addition polymerization can be given as the most common method. The addition polymerization may be carried out after producing an organopolysiloxane, or the polymerization may be carried out after adding an allyl compound having various functional groups to organochlorosilane.

The liquid silicone oil at 25° C. is a compound containing organopolysiloxane as a main component. Various functional groups can be introduced into the terminal or side chain of this liquid silicone rubber at 25° C. There are no specific limitations to the functional group to be introduced. An epoxy group, amino group, methoxy group, phenyl group, carboxyl group, hydroxyl group, alkyl group, vinyl group, mercapto group, and the like can be given as examples. Of these functional groups, a carboxyl group, epoxy group, and polyether group are preferable due to their excellent mutual solubility with the epoxy resin. There are no specific limitations to the method of obtaining organopolysiloxane. A method of obtaining a linear organopolysiloxane by polymerizing three-dimensional non-crosslinked organopolysiloxanes such as methylchlorosilane, trimethyltrichlorosilane, and dimethyldichlorosilane can be given. There are also no specific limitations to the method for introducing various functional groups into the linear organopolysiloxane. A method of adding an allyl compound having various functional groups by addition polymerization is most commonly used. The addition polymerization may be carried out after producing an organopolysiloxane or the polymerization may be carried out after adding a allyl compound having various functional groups to organochlorosilane.

The addition of either the solid silicone rubber at 25° C. or liquid silicone rubber at 25° C., or both, can ensure reduction of a stress caused by inorganic fillers. The use of the solid silicone rubber at 25° C. and liquid silicone rubber at 25° C. in combination is preferable, because the combined use can ensure a low modulus of elasticity, high fluidity, ad high strength, as well as further improvement of the HTOL characteristics.

If necessary, fillers such as titanium white, silicon nitride, ad the like conventionally used for the epoxy resin composition for semiconductor encapsulating may be used. However, for the reasons mentioned above, the average particle diameter of these fillers is preferably 25 μm or less.

In addition to the essential components (A)(E) or (A)-(F), various additives may be added to the epoxy resin composition of the present invention. Such additives include, for example, flame retardants such as a brominated epoxy resin, antimony trioxide, phosphorus compound, magnesium hydroxide, and boric acid compound; inorganic ion exchangers such as bismuth oxide hydrate; coupling agents such as γ-glycidoxypropyltrimethoxysilane and γ-aminopropyltriethoxysilane; coloring agents such as carbon black and red iron oxide; stress reducing agents such as polybutadiene rubber and NBR rubber; and releasing agents such as natural wax, synthetic wax, higher fatty acid and its metal salts, and paraffin. The brominated epoxy resin and antimony trioxide may be added in a small amount to the extent that the reliability in HTSL is satisfied, because the addition of a large amount may reduce the reliability in HTSL.

The epoxy resin composition of the present invention can be obtained by a common method comprising mixing the components using a mixer or the like, melting and kneading using a kneading machine such as a roller, kneader, or extruder, and pulverizing threaded product after cooling.

The semiconductor device of the present invention comprises a semiconductor element encapsulated using the epoxy resin composition. As a method for encapsulating the electronic parts such as a semiconductor element using the epoxy resin composition for semiconductor encapsulating of the present invention, molding and curing methods such as transfer molding, compression molding, and injection molding can be given, for example. In the semi-conductor device of the present invention, the semiconductor element is usually connected to the lead frame or the substrate by a gold wire.

The semiconductor device of the present invention is suitably used for electronic components for which the operation under a high temperature environment exceeding 150° C. must be guaranteed. Although not specifically limited, a power transistor, igniter power amplifier, and the like can be given.

The present invention will be described in more detail by examples, which should not be construed as limiting the present invention. In the examples, the amounts of the components are designated as "part(s) by weight".

Example 1

After mixing the following components using a mixer, the mixture was kneaded using two rollers, one of which had a surface temperature of 90° C. and the other 45° C. The kneaded material was pulverized after cooling to obtain an epoxy resin composition. The epoxy resin composition obtained was evaluated according to the following method of evaluation. The results are shown in Table 1.

| | |
|---|---|
| Biphenyl epoxy resin (YX-4000K manufactured by Japan Epoxy Resins Co., Ltd., epoxy equivalent: 185, melting point: 105° C.) | 5.65 parts by weight |
| Phenol aralkyl resin 2 (phenol resin shown by the formula (3), XL-225 manufactured by Mitsui Chemicals, Inc., softening point: 79° C., hydroxyl equivalent: 174) | 5.35 parts by weight |
| TPP: triphenylphosphine | 0.20 part by weight |
| Fused spherical silica B (average particle size: 11 μm, particles with a particle size of 75 μm or more: 0.3 wt %, particles with a particle size of 64 μm or more: 3 wt %, specific surface area: 4.8 m²/g) | 86.50 parts by weight |
| Spherical alumina (average particle size: 20 μm, particles with a particle size of 75 μm or more: 0.2 wt %, particles with a particle size of 64 μm or more: 5 wt %) | 1.50 parts by weight |
| γ-Glycidylpropyltrimethoxysilane | 0.30 parts by weight |
| Carnauba wax | 0.20 parts by weight |
| Carbon black | 0.30 part by weight |

(Method of Evaluation)

Spiral flow: Using a low-pressure transfer molding machine, the die for measuring a spiral flow conforming to EMMI-1-66 was charged with the epoxy resin composition under the conditions of a die temperature of 175° C., injection pressure of 6.9 MPa, and curing time of 120 seconds to determine the flow distance. The flow distance units are reported as cms.

Glass transition temperature (Tg): A test specimen (10 mm×4 mm×4 mm) was formed using a transfer molding machine under the conditions of a die temperature of 175° C., injection pressure of 9.8 MPa, and curing time of 180 seconds, followed by post-curing at 175° C. for eight hours. Then, TMA analysis was carried out at a temperature rise of 5° C. per minute. The tangent intersection temperature of the resulting TMA curves at 60° C. and 240° C. was read. This temperature was used as the glass transition temperature TMA-100 manufactured by Seiko Instruments, Inc. was used for the measurement. The unit was ° C.

Bending strength and bending modulus of elasticity: A test specimen (length: 80 mm, width: 10 mm thickness: 4 mm) was formed using a transfer molding machine under the conditions of a die temperature of 175° C., pressure of 9.8 MPa, and curing time of 120 seconds, followed by post-curing at 175° C. for eight hours. The bending strength and bending modulus of elasticity were measured according to JIS K6911. The unit for either the bending strength or the bending modulus of elasticity is MPa.

Boiling water absorption: A disk specimen diameter: 50 mm, thickness: 3 mm) was formed using a low pressure transfer molding machine under the conditions of a die temperature of 175° C., injection pressure of 9.8 MPa, and curing time of 120 seconds, followed by post-curing at 175° C. for eight hours. The water absorption was determined from the weight change of the specimen before the moisture absorption treatment and after boiling in purified water for 24 hours. The water absorption rate was indicated by percentage. The unit was %.

Solder resistance: Some pieces of 160 pLQFP were formed using a low pressure transfer molding machine under the conditions of a die temperature of 175° C., injection pressure of 8.3 MPa, and curing time of 120 seconds, followed by post-curing at 175° C. for eight hours. The 160 pLQFP had a package size of 24×24 mm, thickness of 1.4 mm, silicon chip size of 7.0×7.0 mm. The lead frame was formed using a flash plated copper material. The resulting package was treated with moisture at 85° C., a relative humidity of 85% for 72 hours (ten pieces) and for 168 hours (ten pieces), and dipped in a solder vessel at 260° C. for 10 seconds. External cracks were observed by microscope and the rate of crack generation was indicated by [(rate of crack generation)=(number of packages generating cracks)/(total number of packages)× 100]%.

High temperature storage characteristics: A 16 pSOP with a chip size of 3.5 mm×3.5 mm was formed using a transfer molding machine under conditions of a die temperature of 175° C., pressure of 9.8 MPa, and curing time of two minutes, followed by post-curing at 175° C. for eight hours. A high temperature storage test was carried out at 185° C. Packages of which the electric resistance value between the wiring increased 20% from the initial value were judged to be bad. The time required for becoming bad was measured. The time required for becoming bad was an average of n=4. The unit are reported as hours.

High temperature operation characteristics: A 16 pSOP with a chip size of 3.5 mm×3.5 mm was formed using a transfer molding machine under conditions of a die temperature of 175° C., pressure of 9.8 MPa, and curing time of two minutes, followed by post-curing at 175° C. for eight hours. The resulting 16 pSOP was stored at a high temperature of 185° C. by causing 0.5A DC to flow between both ends connected with a daisy chain. Packages of which the electric resistance value between the wiring increased 20% from the initial value were judged to be bad. The time required for becoming bad was measured. The time required for becoming bad was an average of n=4 and the units are reported as hours.

Example 2-11 and Comparative Example 1-7

Epoxy resin compositions were prepared in the same manner as in Example 1 except that the components and the amounts are as shown in Tables 1 and 2. The results are shown in Tables 1 and 2. The materials other than those used in Example 1 were as follows.
o-Cresol Novolac Epoxy Resin
(EOCN-1020-62 manufactured by Nippon Kayaku Co., Ltd., softening point: 62° C., hydroxyl equivalent: 198)
Aralkyl Epoxy Resin
(epoxy resin shown by the formula (4), softening point: 58° C., epoxy equivalent: 212)

(4)

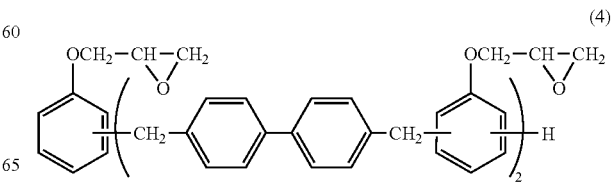

Dicyclopentadiene Epoxy Resin
  (HP-7200 manufactured by Dainippon Ink Industry, softening point: 60° C., hydroxyl equivalent: 263)
Brominated Epoxy Resin
  (BREN-S manufactured by Nippon Kayaku Co., Ltd., softening point: 84° C., hydroxyl equivalent: 273)
Phenol Novolac Resin
  (softening point: 80° C., hydroxyl equivalent: 104)
Phenol Aralkyl Resin 1
  (phenol resin shown by the formula (5), softening point: 73° C., hydroxyl equivalent: 200)

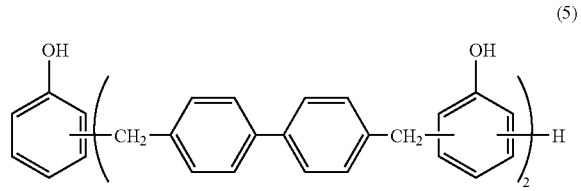

(5)

DBU: 1,8-diazabicyclo(5,4,0)undecene-7
Fused Spherical Silica A
  (average particle size: 8 μm, particles with a particle size of 75 μm or more: 0.5 wt %, particles with a particle size of 64 μm or more: 1 wt %, specific surface area: 5.4 m²/g)
Fused Spherical Silica C
  (average particle size: 18 μm particles with a particle size of 75 μm or more: 0.1 wt % particles with a particle size of 64 μm or more: 4 wt %, specific surface area: 3.0 m²/g)
Fused Spherical Silica D
  (average particle size: 30 μm, particles with a particle size of 75 μm or more: 0.8 wt %, particles with a particle size of 64 μm or more: 12 wt %, specific surface area: 1.3 mm²/g)
Alumina
  (average particle size: 20 μm, particles with a particle size of 75 μm or more: 0.5 wt % particles with a particle size of 64 μm or more: 5 wt %, hexagonal planar crystals)
Aluminums Hydroxide
  (average particle size: 3 μm, particles with a particle size of 75 μm or more: 0 wt %, particles with a particle size of 64 μm or more: 0.1 wt %)
Solid Silicon Rubber
  (crosslinked organosilicon rubber containing a dimethyl silyl group as a main component, average particle size: 12 μm)
Liquid Silicone Oil
  (silicone oil having a polyethylene ether-polypropylene ether polymer grafted on the methyl silyl group side chain, the non-methylsilyl terminal of the polyethylene ether-polypropylene ether polymer having a methyl group or epoxy group, and a dimethyl silicon content of 20%)
Stress Reducing Agent
  (acrylonitrile-butadiene modified rubber, modified rate of acrylonitrile and butadiene: 50:50, average particle size: 3 μm)
Zinc Oxide (Average Particle Size: 0.5 μm)
Magnesium Hydroxide (Mg(OH)$_2$, Average Particle Size: 3 μm)

TABLE 1

|  |  |  | Example | | | | | |
| --- | --- | --- | --- | --- | --- | --- | --- | --- |
|  |  |  | 1 | 2 | 3 | 4 | 5 | 6 |
| Biphenyl epoxy resin |  |  | 5.65 |  | 4.71 | 3.60 | 4.27 |  |
| o-Cresol novolac epoxy resin |  |  |  |  |  |  |  | 7.13 |
| Aralkyl epoxy resin |  |  |  | 9.28 | 2.02 |  | 2.85 |  |
| Dicyclopentadiene epoxy resin |  |  |  |  |  | 3.60 |  |  |
| Brominated epoxy resin |  |  |  |  |  |  |  | 0.50 |
| Phenol novolac resin |  |  |  |  | 2.54 | 3.80 |  | 1.63 |
| Phenol aralkyl resin 1 |  |  |  | 2.86 | 1.69 |  | 5.83 |  |
| Phenol aralkyl resin 2 |  |  | 5.35 | 2.86 |  |  |  | 3.80 |
| TTP |  |  | 0.20 | 0.20 | 0.25 |  | 0.20 |  |
| DBU |  |  |  |  |  | 0.15 |  | 0.15 |
| Fused spherical silica A |  |  |  |  | 50.00 |  | 60.00 |  |
| Fused spherical silica B |  |  | 86.50 |  | 20.00 |  |  |  |
| Fused spherical silica C |  |  |  | 57.00 |  | 86.05 |  | 70.00 |
| Fused spherical silica D |  |  |  | 23.00 | 16.00 |  | 16.05 | 8.50 |
| Alumina | Al content: 52.9% |  |  |  |  | 2.00 | 7.50 |  |
| Spherical alumina | Al content: 52.9% |  | 1.50 | 4.00 |  |  |  | 5.00 |
| Aluminum hydroxide | Al content: 36.0% |  |  |  | 2.00 |  | 2.50 | 2.50 |
| Solid silicone rubber |  |  |  |  |  |  |  |  |
| Liquid silicone oil |  |  |  |  |  |  |  |  |
| Stress reducing agent |  |  |  |  |  |  |  |  |
| γ-Glycidylpropyltrimethoxysilane |  |  | 0.30 | 0.30 | 0.30 | 0.30 | 0.30 | 0.30 |
| Carnauba wax |  |  | 0.20 | 0.20 | 0.20 | 0.20 | 0.20 | 0.20 |
| Carbon black |  |  | 0.30 | 0.30 | 0.30 | 0.30 | 0.30 | 0.30 |
| Al content |  | wt % | 0.79 | 2.12 | 0.72 | 1.06 | 4.87 | 3.55 |
| Spiral flow |  | cm | 115 | 125 | 130 | 120 | 120 | 100 |
| Glass transition temperature (Tg) |  | ° C. | 125 | 125 | 130 | 130 | 125 | 145 |
| Bending strength (260° C.) |  | MPa | 20.0 | 17.0 | 18.5 | 18.0 | 17.5 | 17.5 |
| Bending modulus of elasticity (260° C.) |  | MPa | 700 | 600 | 750 | 800 | 800 | 900 |
| Boiling water absorption |  | wt % | 0.16 | 0.16 | 0.17 | 0.16 | 0.16 | 0.16 |
| Solder resistance | C-72 h/85° C./85% | % | 0 | 0 | 0 | 0 | 0 | 20 |
|  | C-168 h/85° C./85% | % | 20 | 0 | 30 | 40 | 10 | 100 |

TABLE 1-continued

| | | | | | | | | |
|---|---|---|---|---|---|---|---|---|
| High temperature storage characteristics (HTSL) | 185° C. | Time | >1000 | >1000 | >1000 | >1000 | >1000 | 720 |
| High temperature operation characteristics (HTOL) | 185° C., 0.5 A | Time | 60 | 72 | 54 | 48 | 72 | 72 |

| | | | Example | | | | |
|---|---|---|---|---|---|---|---|
| | | | 7 | 8 | 9 | 10 | 11 |
| Biphenyl epoxy resin | | | | | | | |
| o-Cresol novolac epoxy resin | | | 1.80 | | | | |
| Aralkyl epoxy resin | | | 7.20 | 11.17 | 9.92 | 11.17 | 9.92 |
| Dicyclopentadiene epoxy resin | | | | | | | |
| Brominated epoxy resin | | | | | | | |
| Phenol novolac resin | | | 1.20 | | | | |
| Phenol aralkyl resin 1 | | | 4.80 | 6.83 | 6.08 | 6.83 | 6.08 |
| Phenol aralkyl resin 2 | | | | | | | |
| TTP | | | 0.20 | 0.20 | 0.20 | 0.20 | 0.20 |
| DBU | | | | | | | |
| Fused spherical silica A | | | | | | | |
| Fused spherical silica B | | | 77.50 | 20.00 | 20.00 | 20.00 | 20.00 |
| Fused spherical silica C | | | | 50.00 | 50.00 | 50.00 | 50.00 |
| Fused spherical silica D | | | 5.00 | | | | |
| Alumina | Al content: 52.9% | | | | | | |
| Spherical alumina | Al content: 52.9% | | | 5.00 | 5.00 | 5.00 | 5.00 |
| Aluminum hydroxide | Al content: 36.0% | | 1.50 | 4.00 | 4.00 | 4.00 | 4.00 |
| Solid silicone rubber | | | | 2.00 | 2.00 | | 1.00 |
| Liquid silicone oil | | | | | 2.00 | 2.00 | 2.00 |
| Stress reducing agent | | | | | | | 1.00 |
| γ-Glycidylpropyltrimethoxysilane | | | 0.30 | 0.30 | 0.30 | 0.30 | 0.30 |
| Carnauba wax | | | 0.20 | 0.20 | 0.20 | 0.20 | 0.20 |
| Carbon black | | | 0.30 | 0.30 | 0.30 | 0.30 | 0.30 |
| Al content | | wt % | 0.54 | 4.09 | 4.09 | 4.09 | 4.09 |
| Spiral flow | | cm | 130 | 125 | 145 | 135 | 140 |
| Glass transition temperature (Tg) | | ° C. | 135 | 125 | 125 | 125 | 125 |
| Bending strength (260° C.) | | MPa | 17.0 | 16.5 | 17.5 | 16.0 | 17.0 |
| Bending modulus of elasticity (260° C.) | | MPa | 700 | 550 | 450 | 500 | 450 |
| Boiling water absorption | | wt % | 0.17 | 0.17 | 0.18 | 0.17 | 0.18 |
| Solder resistance | C-72 h/85° C./85% | % | 0 | 0 | 0 | 0 | 0 |
| | C-168 h/85° C./85% | % | 100 | 0 | 10 | 0 | 10 |
| High temperature storage characteristics (HTSL) | 185° C. | Time | >1000 | >1000 | >1000 | >1000 | >1000 |
| High temperature operation characteristics (HTOL) | 185° C., 0.5 A | Time | 56 | 108 | 96 | 108 | 96 |

TABLE 2

| | | | Comparative Example | | | | | | |
|---|---|---|---|---|---|---|---|---|---|
| | | | 1 | 2 | 3 | 4 | 5 | 6 | 7 |
| Biphenyl epoxy resin | | | 5.65 | | 4.71 | 3.60 | 4.27 | | |
| o-Cresol novolac epoxy resin | | | | | | | | 1.80 | |
| Aralkyl epoxy resin | | | | 9.28 | 2.02 | | 2.85 | 7.20 | 11.17 |
| Dicyclopentadiene epoxy resin | | | | | | 3.60 | | | |
| Brominated epoxy resin | | | | | | | | | |
| Phenol novolac resin | | | | | 2.54 | 3.80 | | 1.20 | |
| Phenol aralkyl resin 1 | | | | 2.86 | 1.69 | | 5.83 | 4.80 | 6.83 |
| Phenol aralkyl resin 2 | | | 5.35 | 2.86 | | | | | |
| TTP | | | 0.20 | 0.20 | 0.25 | | 0.20 | 0.20 | 0.20 |
| DBU | | | | | | 0.15 | | | |
| Fused spherical silica A | | | | | 50.00 | | 70.00 | | |
| Fused spherical silica B | | | 88.00 | | 20.00 | | | 77.50 | 20.00 |
| Fused spherical silica C | | | | 57.00 | | | | | 61.00 |
| Fused spherical silica D | | | | 23.00 | 16.00 | 86.05 | 16.05 | 5.00 | |
| Alumina | Al content: 52.9% | | | | | 2.00 | | | |
| Zinc oxide | | | | | | 2.00 | | 1.50 | |
| Magnesium hydroxide | | | | 4.00 | | | | | |
| γ-Glycidylpropyltrimethoxysilane | | | 0.30 | 0.30 | 0.30 | 0.30 | 0.30 | 0.30 | 0.30 |
| Carnauba wax | | | 0.20 | 0.20 | 0.20 | 0.20 | 0.20 | 0.20 | 0.20 |
| Carbon black | | | 0.30 | 0.30 | 0.30 | 0.30 | 0.30 | 0.30 | 0.30 |
| Al content | | wt % | 0 | 0 | 0 | 1.06 | 0 | 0 | 0 |
| Spiral flow | | cm | 115 | 105 | 120 | 100 | 100 | 130 | 120 |
| Glass transition temperature (Tg) | | ° C. | 120 | 110 | 130 | 140 | 120 | 130 | 125 |
| Bending strength (260° C.) | | MPa | 20.0 | 16.0 | 18.5 | 18.0 | 17.5 | 17.0 | 17.0 |

TABLE 2-continued

| | | Comparative Example | | | | | | |
|---|---|---|---|---|---|---|---|---|
| | | 1 | 2 | 3 | 4 | 5 | 6 | 7 |
| Bending modulus of elasticity (260° C.) | MPa | 700 | 650 | 750 | 950 | 800 | 700 | 800 |
| Boiling water absorption | wt % | 0.16 | 0.17 | 0.18 | 0.18 | 0.16 | 0.18 | 0.17 |
| Solder resistance | C-72 h/85° C./85% % | 0 | 0 | 0 | 0 | 0 | 20 | 0 |
| | C-168 h/85° C./85% % | 10 | 10 | 30 | 30 | 20 | 100 | 0 |
| High temperature storage characteristics (HTSL) | 185° C. Time | >1000 | >1000 | >1000 | >1000 | >1000 | 720 | >1000 |
| High temperature operation characteristics (HTOL) | 185° C., 0.5 A Time | 18 | 18 | 6 | 24 | 12 | 12 | 24 |

INDUSTRIAL APPLICABILITY

An epoxy resin composition which excels in both high temperature storage characteristics and reliability during high temperature operation can be provided in the present invention and is suitably used for a semiconductor device, used under a high temperature environment such as a semiconductor device in the engine compartment of vehicles or the vehicle body.

The invention claimed is:

1. An epoxy resin composition for semiconductor encapsulating, comprising:

an epoxy resin represented by a formula,

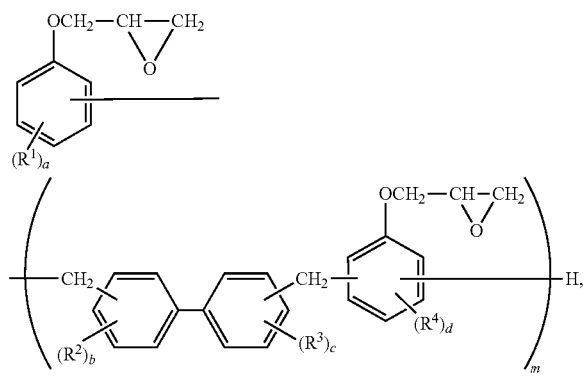

wherein $R^1$, $R^2$, $R^3$, and $R^4$ are individually a hydrogen atom or an alkyl group having 1-4 carbon atoms; a and d are individually integers of 0-3; b and c are individually integers of 0-4; and m is an average of positive numbers;

a phenol resin represented by a formula,

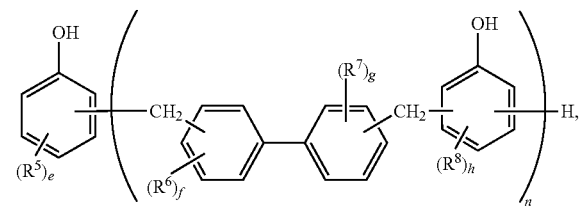

wherein $R^5$, $R^6$, $R^7$, and $R^8$ are individually a hydrogen atom or an alkyl group having 1-4 carbon atoms; e and h are individually integers of 0-3; f and g are individually integers of 0-4; and n is an average of positive numbers;

a curing accelerator;

silica, wherein 70 wt % or more of the silica has an average particle size of 25 μm or less; and alumina and aluminum hydroxide, wherein the amount of aluminum to the total amount of said epoxy resin composition is 0.25-5 wt %, the alumina and aluminum hydroxide have an average particle size of 1 to 25 μm, an amount of the alumina and aluminum hydroxide with a diameter of 75 μm or more is 2 wt % or less, and an amount of the alumina and aluminum hydroxide with a diameter of 64 μm or more is 20 wt % or less, wherein the epoxy resin of the formula is in an amount of 100 wt % of the total epoxy resin amount, and the phenol resin of the formula is in an amount of 100 wt % of the total phenol resin amount.

2. The epoxy resin composition for semiconductor encapsulating according to claim 1, further comprising at least one of a silicone rubber which is solid at 25° C. and a silicone oil which is liquid at 25° C. in an amount of 0.5-5 wt % of the total amount of said epoxy resin composition.

3. The epoxy resin composition for semiconductor encapsulating according to claim 1, wherein the epoxy resin is shown by a formula,

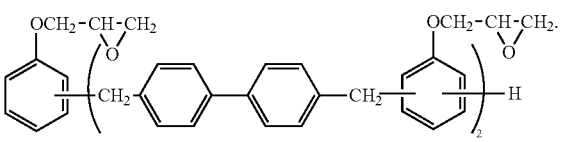

4. The epoxy resin composition for semiconductor encapsulating according to claim 1, wherein the phenol resin is shown by a formula,

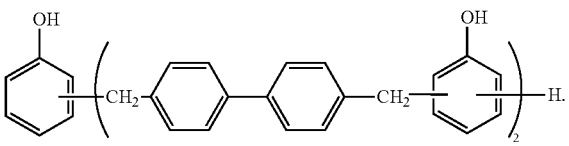

5. The epoxy resin composition for semiconductor encapsulating according to claim 1, wherein the alumina is spherical alumina.

6. The epoxy resin composition for semiconductor encapsulating according to claim 1, further comprising a silicone rubber which is solid at 25° C. and a silicone oil which is liquid at 25° C. in an amount of 0.5-5 wt % of the total amount of said epoxy resin composition.

7. The epoxy resin composition for semiconductor encapsulating according to claim 1, wherein the epoxy resin of the formula is in an amount ranging from 9.92 to 11.17 parts by weight of the total epoxy resin composition, and the phenol resin of the formula is in an amount ranging from 6.08 to 6.83 parts by weight of the total epoxy resin composition.

8. An epoxy resin composition for semiconductor encapsulating, consisting essentially of:
an epoxy resin represented by a formula,

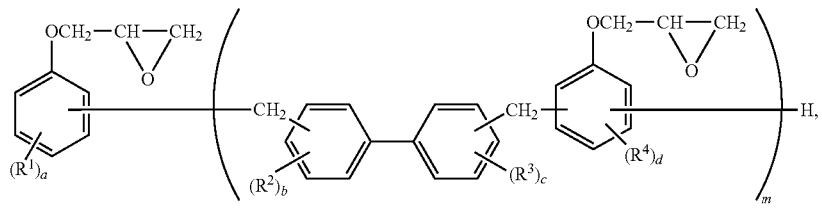

wherein $R^1$, $R^2$, $R^3$, and $R^4$ are individually a hydrogen atom or an alkyl group having 1-4 carbon atoms; a and d are individually integers of 0-3; b and c are individually integers of 0-4; and m is an average of positive numbers;
a phenol resin represented by a formula,

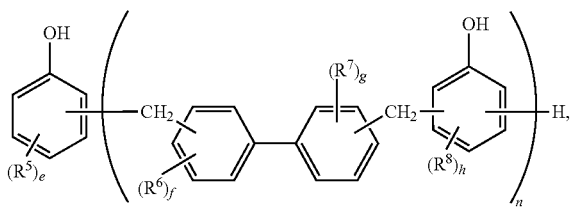

wherein $R^5$, $R^6$, $R^7$, and $R^8$ are individually a hydrogen atom or an alkyl group having 1-4 carbon atoms; e and h are individually integers of 0-3; f and g are individually integers of 0-4; and n is an average of positive numbers;
a curing accelerator;
silica, wherein 70 wt % or more of the silica has an average particle size of 25 μm or less; and
alumina and aluminum hydroxide, wherein the amount of aluminum to the total amount of said epoxy resin composition is 0.25-5 wt %, the alumina and aluminum hydroxide have an average particle size of 1 to 25 μm, an amount of the alumina and aluminum hydroxide with a diameter of 75 μm or more is 2 wt % or less, and an amount of the alumina and aluminum hydroxide with a diameter of 64 μm or more is 20 wt % or less,
wherein the epoxy resin of the formula is in an amount of 100 wt % of the total epoxy resin amount, and the phenol resin of the formula is in an amount of 100 wt % of the total phenol resin amount.

9. The epoxy resin composition for semiconductor encapsulating according to claim 8, further comprising at least one of a silicone rubber which is solid at 25° C. and a silicone oil which is liquid at 25° C. in an amount of 0.5-5 wt % of the total amount of said epoxy resin composition.

10. The epoxy resin composition for semiconductor encapsulating according to claim 8, wherein the epoxy resin is shown by a formula,

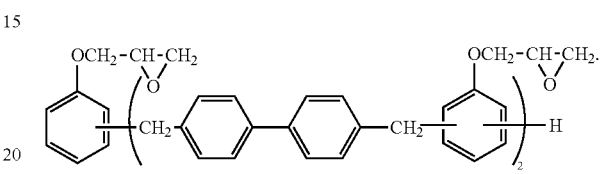

11. The epoxy resin composition for semiconductor encapsulating according to claim 8, wherein the phenol resin is shown by a formula,

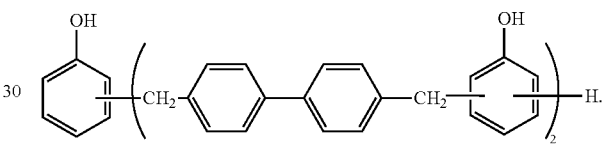

12. The epoxy resin composition for semiconductor encapsulating according to claim 8, wherein the alumina is spherical alumina.

13. The epoxy resin composition for semiconductor encapsulating according to claim 8, further comprising a silicone rubber which is solid at 25° C. and a silicone oil which is liquid at 25° C. in an amount of 0.5-5 wt % of the total amount of said epoxy resin composition.

14. The epoxy resin composition for semiconductor encapsulating according to claim 8, wherein the epoxy resin of the formula is in an amount ranging from 9.92 to 11.17 parts by weight of the total epoxy resin composition, and the phenol resin of the formula is in an amount ranging from 6.08 to 6.83 parts by weight of the total epoxy resin composition.

15. A method of using the epoxy resin composition for semiconductor encapsulating according to claim 8 for encapsulating semiconductor devices used in a high temperature environment of 150° C. or more comprising molding and curing the epoxy composition of claim 11 to encapsulate a semiconductor device.

16. A semiconductor device comprising a semiconductor element encapsulated with the epoxy resin composition for semiconductor encapsulating according to claim 8.

17. The semiconductor device according to claim 16, wherein the semiconductor element is connected to the lead frame or the substrate by a gold wire.

18. The semiconductor device according to claim 16 which is used in a high temperature environment of 150° C. or more.

* * * * *